(12) United States Patent
Taguchi et al.

(10) Patent No.: US 7,744,396 B2
(45) Date of Patent: Jun. 29, 2010

(54) IC SOCKET AND IC SOCKET ASSEMBLY

(75) Inventors: Hidenori Taguchi, Kanagawa (JP); Shinichi Hashimoto, Kanagawa (JP)

(73) Assignee: Tyco Electronics Japan G.K., Kanagawa-Ken (JP)

( * ) Notice: Subject to any disclaimer, the term of this patent is extended or adjusted under 35 U.S.C. 154(b) by 202 days.

(21) Appl. No.: 11/995,648

(22) PCT Filed: Jul. 3, 2006

(86) PCT No.: PCT/JP2006/313206

§ 371 (c)(1), (2), (4) Date: Jan. 14, 2008

(87) PCT Pub. No.: WO2007/007572

PCT Pub. Date: Jan. 18, 2007

(65) Prior Publication Data

US 2009/0286417 A1 Nov. 19, 2009

(30) Foreign Application Priority Data

Jul. 14, 2005 (JP) .............................. 2005-205898

(51) Int. Cl.
*H01R 13/62* (2006.01)
(52) U.S. Cl. .................................................... 439/331
(58) Field of Classification Search ................. 439/331, 439/326, 328, 526, 66–73; 361/737
See application file for complete search history.

(56) References Cited

U.S. PATENT DOCUMENTS

| | | | | |
|---|---|---|---|---|
| 5,791,914 A | * | 8/1998 | Loranger et al. | 439/71 |
| 6,717,805 B2 | * | 4/2004 | Liu et al. | 361/679.32 |
| 7,080,986 B2 | * | 7/2006 | Ma | 439/41 |
| 7,429,182 B1 | * | 9/2008 | Zheng et al. | 439/135 |
| 7,435,119 B2 | * | 10/2008 | Chang et al. | 439/188 |

FOREIGN PATENT DOCUMENTS

| | | |
|---|---|---|
| JP | 07-282931 | 10/1995 |
| JP | 09-178805 | 7/1997 |
| JP | 10-302925 | 11/1998 |
| JP | 2002-280137 | 9/2002 |
| JP | 2005-019284 | 1/2005 |

\* cited by examiner

*Primary Examiner*—Jean F Duverne
(74) *Attorney, Agent, or Firm*—Barley Snyder LLC

(57) ABSTRACT

An IC socket for receiving an IC package having a plurality of electrical contacts on a bottom face thereof is disclosed. The IC socket has an insulating housing that receives the IC package and a plurality of elastic contacts, one end each being secured to the insulating housing, and a remaining end of each contacting at least one of the electrical contacts on the bottom face of the IC package. The IC socket also has a spring member carried by the insulating housing that determines an accepting position for the IC package being accepted into the insulating housing, and that restrains an amount of horizontal movement of the IC package caused by bending of the elastic contacts as the IC package is pressed down.

16 Claims, 8 Drawing Sheets

IC SOCKET AND IC SOCKET ASSEMBLY

CROSS-REFERENCE TO RELATED APPLICATION DATA

This application claims the benefit of the earlier filed international patent application PCT/JP2006/313206 having a filing date of Jul. 3, 2006 which claims the benefit of the earlier filed Japanese patent document JP 2005-205898 having a filing date of Jul. 14, 2005.

FIELD OF THE INVENTION

The present invention relates to an Integrated Circuit (IC) socket.

BACKGROUND

There are various kinds of IC packages that package a semiconductor device. For example, one type called LGA (Land Grid Array) in which a flattened pad is arranged, one type called BGA (Ball Grid Array) in which a spherical pad is arranged, and one type called PGA (Pin Grid Array) in which a lead pin is arranged. When the various kinds of IC packages are electrically connected with a wiring pattern on a circuit board, an IC socket which has a contact which makes electrical contact to a wiring pattern on a circuit board (for example, see Patent Documents: Japanese Patent Application Publication No. Hei 7-282931, Japanese Patent Application Publication No. Hei 10-302925, and Japanese Patent Application Publication No. 2005-19284) has been used. It is desirable to increase the density of electrical contacts of pads or the like in IC packages and the corresponding electrical contacts of IC sockets.

Prior Art FIGS. 1A-1C show a part of an existing IC socket which accepts an IC package type called LGA.

Prior Art FIGS. 1A-1C show an insulating housing 91 and a contact 92 both of which are included in an IC socket 9, an IC package 8 which is mounted in the IC socket 9, and a pad 81 of the IC package 8. In the insulating housing 91 is a recess 911 in which the IC package 8 is accepted from an upper side. A cantilever spring is applied to the contact 92, and a side of a contact point 921 shown left in Prior Art FIGS. 1A-1C is a free end. In the socket 9 which employs the contact 92 in a cantilever spring form, when the IC package 8 is pressed down (a vertical load is applied), the IC package 8 goes down with the contact 92 being bent, and a contact position slides horizontally in a plan view.

Prior Art FIG. 1A shows a state in which the IC package 8 is set from above in the recess 911 so that the IC package 8 is settled at a side in a direction in which the IC package 8 is going to slide (left side, see an arrow in Prior Art FIG. 1C). Prior Art FIG. 1B shows a state where the IC package 8 is set in the recess from above so that the IC package 8 is settled at a side opposite to the direction in which the IC package is going to slide (right side).

In the states shown in Prior Art FIGS. 1A and 1B, the contact 92 of the IC socket 9 contacts with the pad 81 of the IC package 8 set in the recess 911 of the IC socket 9. The IC package 8 set in the recess 911 of the IC socket 9 receives a vertical load by a pressing cover (not shown). Accordingly, the IC package 8 is pressed in until a bottom face 80 of the IC package abuts on a support section 912 of the insulating housing 91.

Prior Art FIG. 1C shows a state in which the IC package 8 shown in Prior Art FIG. 1B is pressed in until the bottom face 80 abuts on the support section 912 of the insulating housing 91.

When a vertical load is applied to the IC package 8 which is set at the side opposite to the direction in which the IC package is going to slide (see the arrow in Prior Art FIG. 1C), the contact 92 in a cantilever spring form of the IC socket 9 falls downward (see the contact shown by dotted line in the drawing), and the contact point 921 moves left in the drawing. At this point, an amount of the movement is described as R in the drawing. When the contact point 921 of the contact 92 is moved left in the drawing, the pad 81 of the IC package 8 slides as well by friction. Accordingly, by this friction of the sliding, the IC package also slides left in the drawing (see the arrow in Prior Art FIG. 1C). As a result, the IC package 8 abuts on the edge 911a of the recess 911, and the bottom face 80 abuts on the support section 912 of the insulating housing 91. Thus, the IC package 8 is positioned in a final predetermined mount position. In the IC socket 9 shown in Prior Art FIG. 1B, when a vertical load is applied to the IC package 8, the IC package 8 is moved left. At this point, an amount of movement is described as S in the drawing. Therefore, an amount of relative movement of the contact 921 to the pad 81 of the IC package becomes |R-S|.

In addition, by the sliding of the contact 92 and the pad 81, oxide film formed on the pad and contact is removed.

As shown in Prior Art FIG. 1A, when a vertical load is applied through the pressing cover (not shown) to the IC package set in the recess 911 in the state in which the IC package is settled at the side in the direction in which the IC package 8 is going to slide (see the arrow in of Prior Art FIG. 1C), the IC package 8 goes downward. However, because the IC package 8 is already in contact with the edge 911a of the recess 911 before the vertical load is applied, the IC package 8 may not slide left further more in the drawing. Therefore, in this case an amount of relative movement of the contact point 921 to the pad 81 of the IC package 8 is R, which is larger than the amount of relative movement of the IC socket 9 shown in Prior Art FIG. 1B whose amount of relative movement is |R-S|. Or, a contacting point of the contact 92 with the pad 91 is shifted left by R while the state is changed from where the IC package is set in the recess to where the IC package is positioned in the final predetermined mount position. Regarding the IC package 8 shown in Prior Art FIG. 1C, in consideration of the sliding distance by R in which the contacting point of the contact 92 with the pad 81 is shifted left when the IC package is set in the recess 911 in the state in which the IC package 8 is settled at the side in the direction (see the arrow in Prior Art FIG. 1C) in which the IC package 8 is going to slide as shown in Prior Art FIG. 1A, the pad 81 is made larger than an enough size required to make electrical contact with the contact point 921 of the contact 92. Therefore, density increase of an electrical contact (or pad) in an IC package is restrained. In addition, because the contact 92 of the IC socket 9 corresponds to the pad of the IC package 8, a pitch between each adjacent contact 81 becomes bigger as the pad 81 gets larger. Accordingly, density increase of an electrical contact in an IC socket is also restrained.

Referring to FIG. 1B again, the IC package 8 shown in slides to the final mount position. If a distal end 801 in a direction in which the IC package 8 slides abuts on the edge 911a of the recess 911 before the bottom face 80 of the IC package 8 abuts on the support section 912 of the insulating housing 91, friction increases because both the distal end 801 of the IC package 8 and the edge 911a of the insulating housing 91 are made of resin. Accordingly, the IC package 8 does not move further down, which is problematic. Even if the IC package 8 moves down, when the IC package 8 moves down, the bottom face 80 abuts on the support section 912 while the IC package 8 and the insulating housing 91 scrape each other.

SUMMARY

The present invention relates to, in at least one embodiment among others, an IC socket for receiving an IC package having a plurality of electrical contacts on a bottom face thereof. The IC socket has an insulating housing that receives the IC package and a plurality of elastic contacts, one end each being secured to the insulating housing, and a remaining end of each contacting at least one of the electrical contacts on the bottom face of the IC package. The IC socket also has a spring member carried by the insulating housing that determines an accepting position for the IC package being accepted into the insulating housing, and that restrains an amount of horizontal movement of the IC package caused by bending of the elastic contacts as the IC package is pressed down.

BRIEF DESCRIPTION OF THE DRAWINGS

Prior Art

DETAILED DESCRIPTION OF THE EMBODIMENT(S)

An exemplary embodiment according to an aspect of the invention will be described below with reference to the drawings.

Figure 1A:
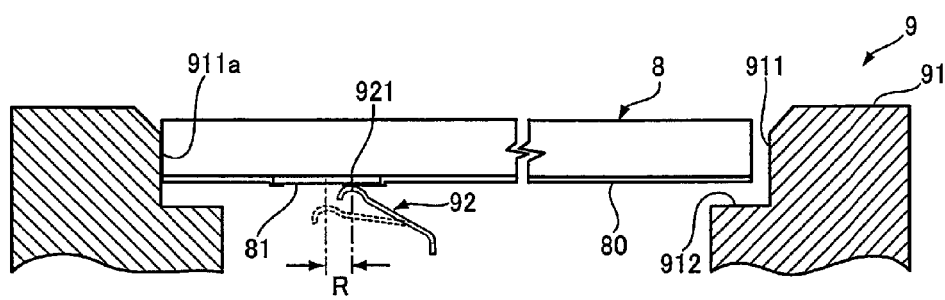
FIGS. 1A-1C show a portion of a conventional IC socket that accepts an IC socket called a LGA.
Figure 1B:
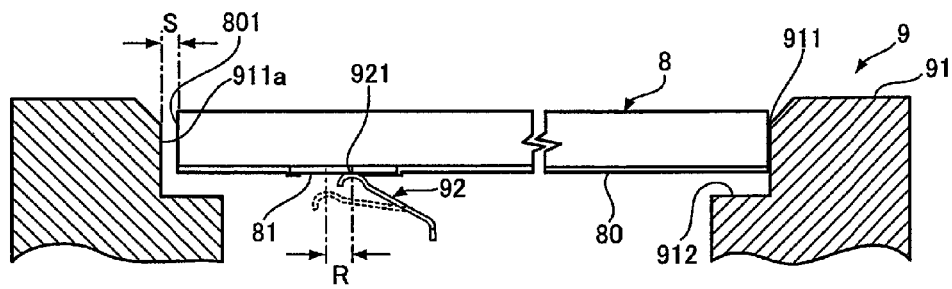
Figure 1C:
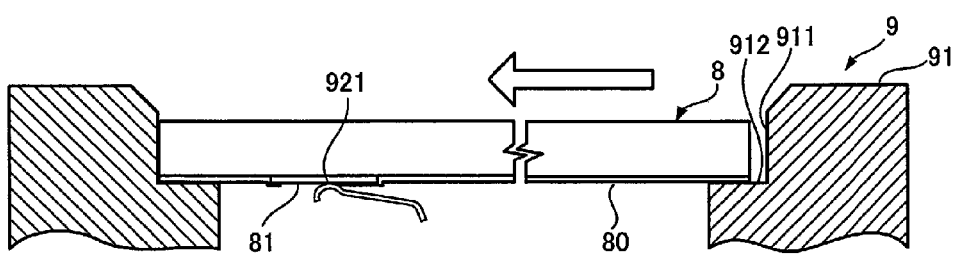
Figure 2:
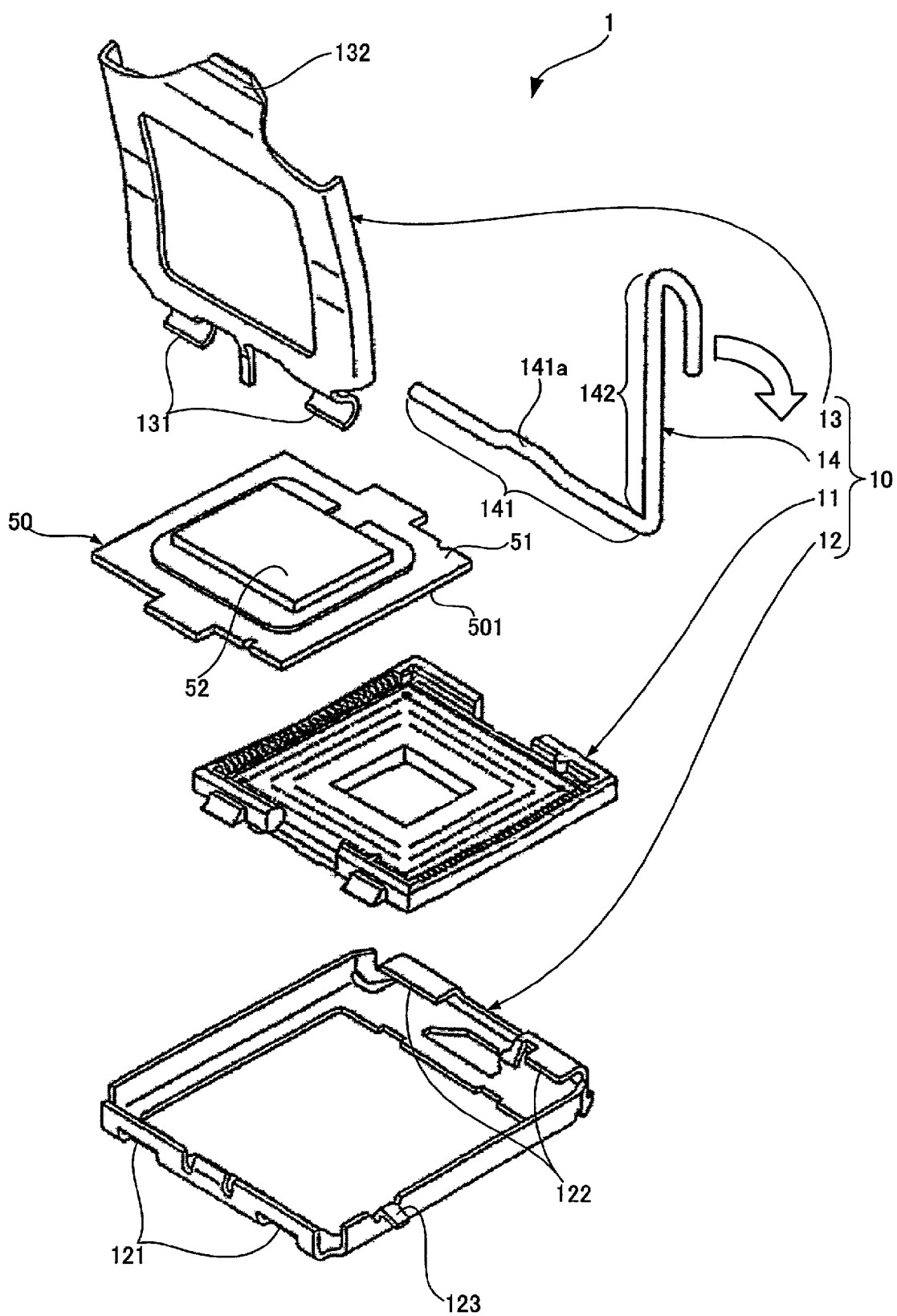
FIG. 2 is an exploded perspective view of an IC socket assembly according to an embodiment of the present invention.

FIG. 2 is an exploded perspective view of a disassembled IC socket assembly 1 according to an embodiment of the present invention.

An IC socket assembly 1 shown in FIG. 2 comprises an IC package 50 and an IC socket 10 that accepts the IC package 50. The IC socket 10 shown in FIG. 2 is a socket for an IC package type called LGA on a bottom face of which a plurality of flatted pads are arranged in a matrix. The IC socket 10 is surface-mounted on a mother board which is incorporated in a personal computer. A CPU (Central Processing Unit) is mounted on the mother circuit board. The IC socket 10 corresponds to one embodiment of an IC socket according to the present invention. The IC socket 10 comprises an insulating housing 11, a load supporting member 12, a pressing cover 13, and a lever 14. Although not shown in the drawing, a plurality of solder balls are arranged on a bottom face of the insulating housing 11. The IC socket 10 is mounted by the solder balls on the mother board.

The IC package 50 shown in FIG. 2 is an LGA type. In the IC package 50, a core of the CPU mounted on a circuit board 51 made of glass epoxy is covered by a metal member 52.

The lever 14 shown in FIG. 2 comprises a cranked section 141 and an operating section 142 and thus is L-shaped. The lever 14 shown in FIG. 2 is in a position in which the operating section 142 is upright. The pressing cover 13 is shown in an opened position.

In the IC socket 10 shown in FIG. 2, a pair of engagement members 131 of the pressing cover 13 made of metal are rotatable when being inserted into openings 121 formed in both sides of an end (front left in FIG. 2) of the load supporting section 12 made of metal. The pressing cover 13 opens and closes by rotating about the one end of the load supporting section 12. The cranked member 141 of the lever 14 is inserted into bearing members 122 on both sides of the other end (right back in FIG. 2) of the load supporting section 12. In a position in which the operating section 142 is upright, a crank 141a is also upright between the bearing members 122, allowing the pressing cover 13 to freely open and close.

When the IC package 50 is inserted in the IC socket 10 shown in FIG. 2, the pressing cover 13 is opened (see FIG. 3A), and the IC package 50 is set in the insulating housing 11 from above, with a bottom face 501 facing the insulating housing from above. When the pressing cover 13 is in a closed position and the operating section 142 of the lever 14 is pushed over toward a direction indicated by an arrow shown in FIG. 2, the crank 141a is also pushed over and presses down a pressing tip 132 of the pressing cover 13. Thus, in the IC socket 10 shown in FIG. 2, vertical load is given to the IC package 50 set in the insulating housing 11. The operating section 142 pushed over is engaged with an engagement section 123 of the load supporting section 12. Accordingly, vertical load is continuously given to the IC package 50.

Figure 3B:
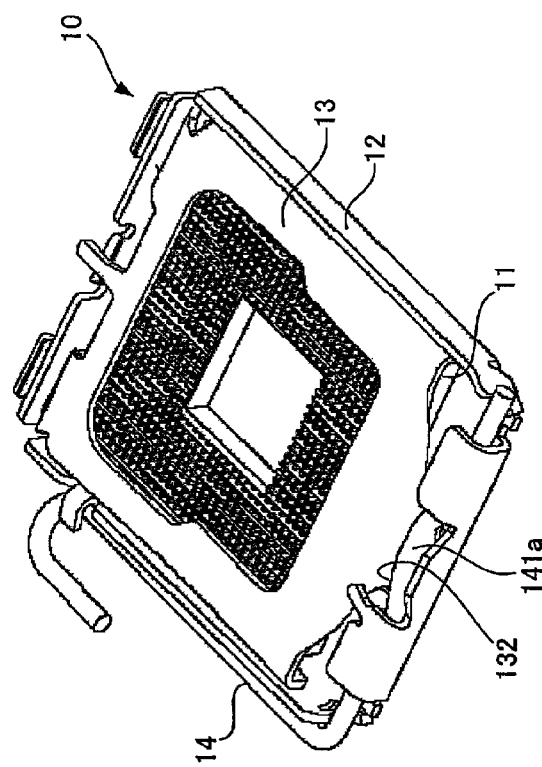
FIG. 3B is a perspective view of the IC socket of FIG. 2 with the pressing cover closed.
Figure 3A:
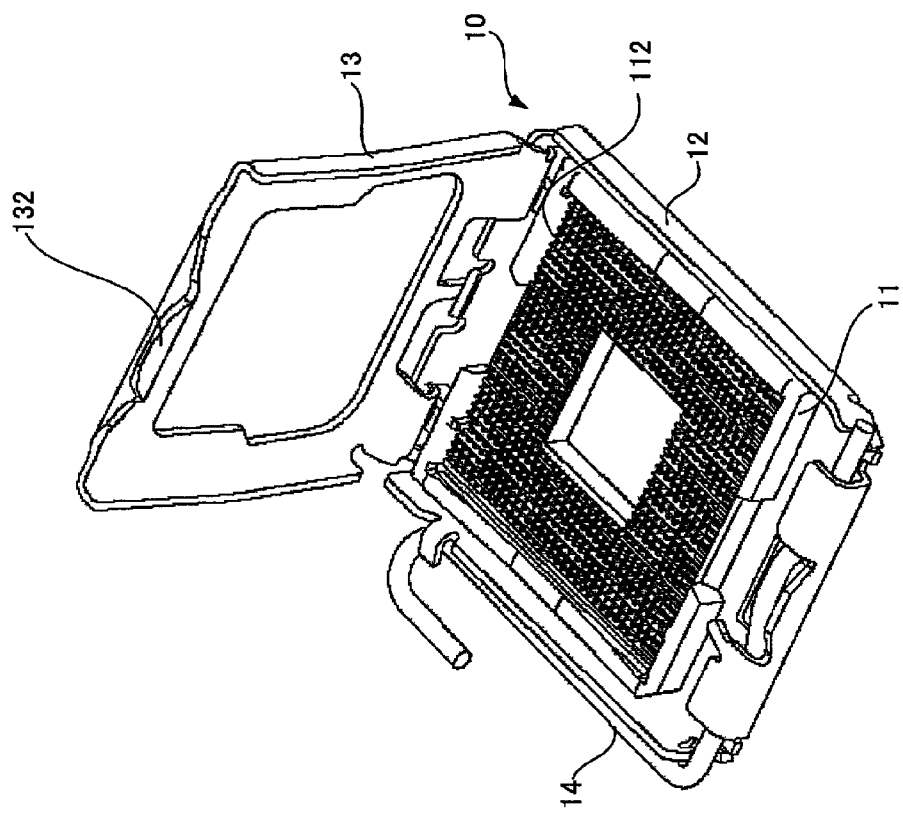
FIG. 3A is a perspective view of the IC socket of FIG. 2 with the pressing cover open.

FIGS. 3A and 3B are perspective views of the IC socket 10 according to the embodiment.

FIG. 3A shows a state in which the pressing cover 13 is open while the one end shown left front in FIG. 2 is right back. FIG. 3B shows a state in which the pressing cover 13 is closed and the crank 141a presses down the pressing tip 132 of the pressing cover 13. A plurality of elastic contacts 112 are arranged in the insulating housing 11.

Figure 4:
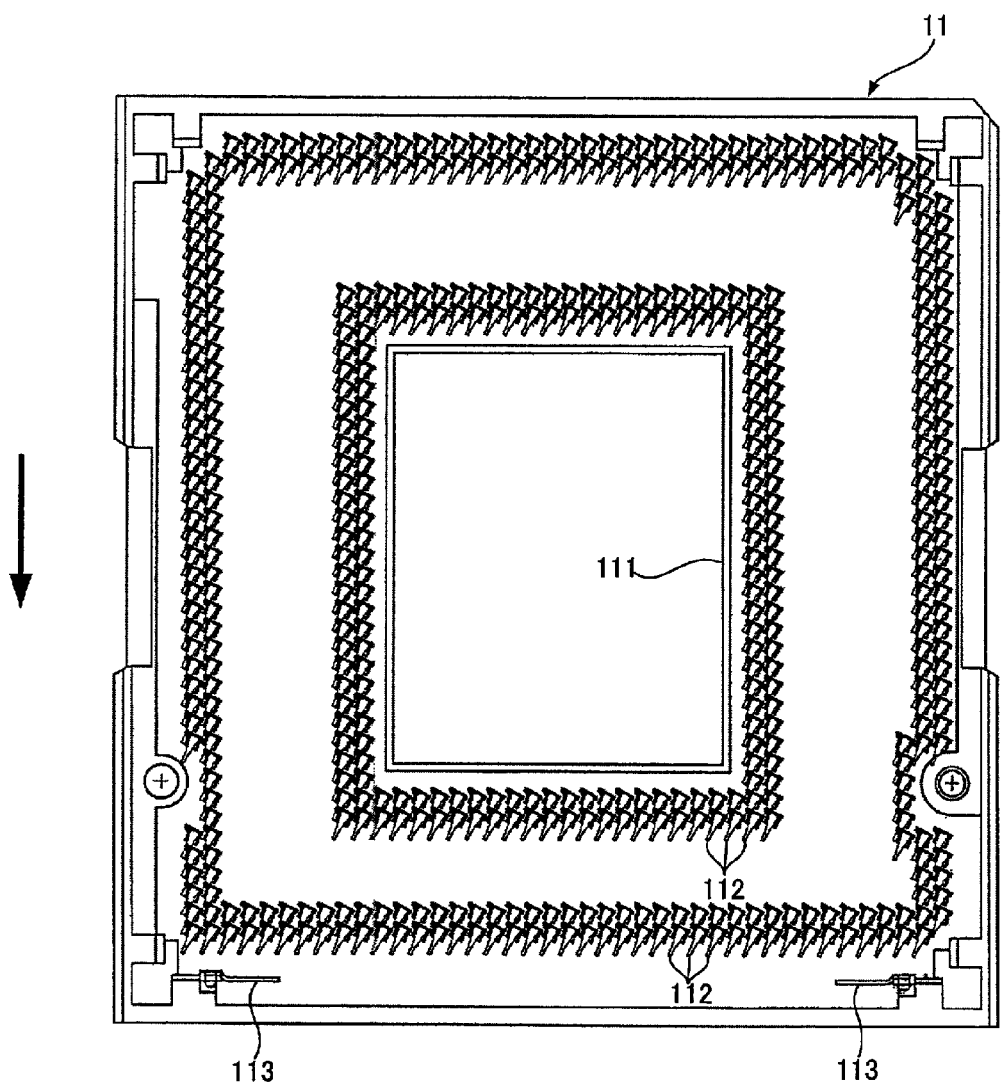
FIG. 4 schematically shows an insulating housing of the IC socket of FIG. 2.

FIG. 4 schematically shows the insulating housing 11 of the IC socket shown in FIG. 2. The insulating housing 11 is made of resin and accepts the IC package 50 from an upper side (from this side of the sheet in FIG. 4). An opening 111 which is rectangular in a view from an upper side is formed in the center of the insulating housing 11. The elastic contacts 112 are arranged in layers such that they encompass the opening 111. In FIG. 4, the elastic contacts 112 for inner two layers and the elastic contacts 112 for outer two layers are shown and the other elastic contacts arranged between the inner two layers and the outer two layers are not shown. Each of the elastic contacts 112 is in a cantilever spring form, and is arranged such that one end as a free end of each of the elastic contacts 112 is set in one direction. Every elastic contact 112 shown in FIG. 2 points downward in the drawing. The insulating housing 11 allows the IC package 50 accepted to slide in a direction in which the end of the elastic contact 112 points.

In addition, spring members 113 are arranged on both right and left sides of a wall to which the end of the elastic contact 112 points. Each spring member 113 is made of metal and press-fitted to be secured. In an alternative embodiment the spring members may be made of resin and be integrated with the insulating housing.

Figure 5:
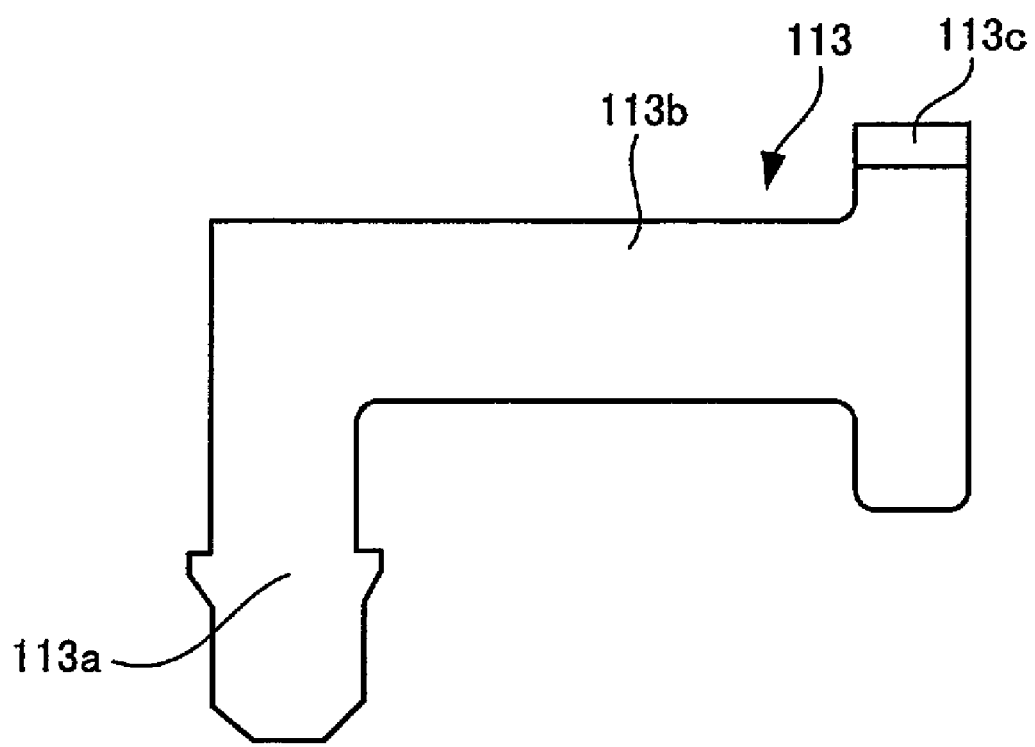
FIG. 5 is an orthogonal view of a spring member for being press-fitted to the insulating housing of the IC socket of FIG. 2.

FIG. 5 shows the spring member 113 before the spring member 113 is press-fitted to be secured. The spring member 113 shown is located in a right portion of the insulating housing 11 shown in FIG. 4.

The spring member 113 shown in FIG. 5 comprises a fixing section 113a which is press-fitted to be secured. An end of an arm section 113b which is perpendicularly turned from the fixing section 113a and extends right in the drawing is a free end. In the end, a bent section 113c which is bent horizontally (a perpendicular direction to the sheet in FIG. 5) is formed.

Figures 6A, 6B:
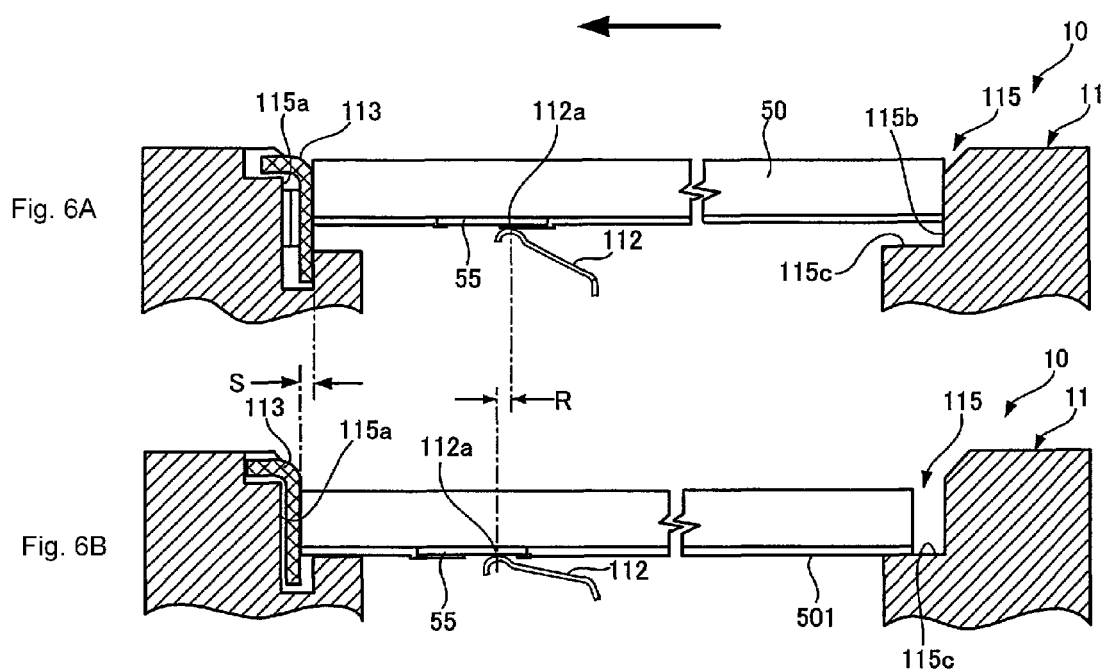
FIG. 6A is an orthogonal view of the IC socket of FIG. 2 showing a state where the IC package is set in an initial position in the insulating housing.
FIG. 6B is an orthogonal view of the IC socket of FIG. 2 showing a state in which the IC package is arranged in a final predetermined position in the insulating housing.

FIGS. 6A and 6B are views to compare a state in which the IC package is set in an initial position (see FIG. 6A) in the insulating housing with a state in which the package is arranged in a final predetermined position (see FIG. 6B).

The insulating housing 11 includes a recess 115 which accepts the IC package 50 from above. The recess 115 is made larger than the size of the package 50, so that the IC package 50 accepted slides from right to left in the drawing (see the arrow). That is, the insulating housing 11 allows the IC package 50 to slide horizontally. The recess 115 comprises a downstream wall 115a in a downstream side of the direction in which the IC package 50 is going to slide, an upstream wall 115b in an upstream side (the opposite side) of the direction in which the IC package 50 is going to slide, and a bottom wall 115c which is a supporting section.

FIG. 6A shows a view in which the IC package 50 is set in the recess 115 of the insulating housing 11. The IC package 50 set in the recess 115 of the insulating housing 11 is pressed right in the drawing by the spring member 113, so that the IC package 50 abuts on the upstream wall 115b of the recess 115 in the upstream side of the sliding direction. In other words, in the IC socket 10, the IC package 50 is set in a state in which the IC package 50 comes opposite side to the direction in which the IC package 50 is going to slide (see the arrow) by the spring member 113. FIG. 6A shows that although the IC package 50 is in a state in which the IC package abuts on the upstream all 115b of the recess 115 in the upstream side of the direction in which the IC package 50 slides, a pad 55 arranged on the bottom face of the IC package 50 contacts the elastic contact 112 arranged in the insulating housing 11.

Figure 7:
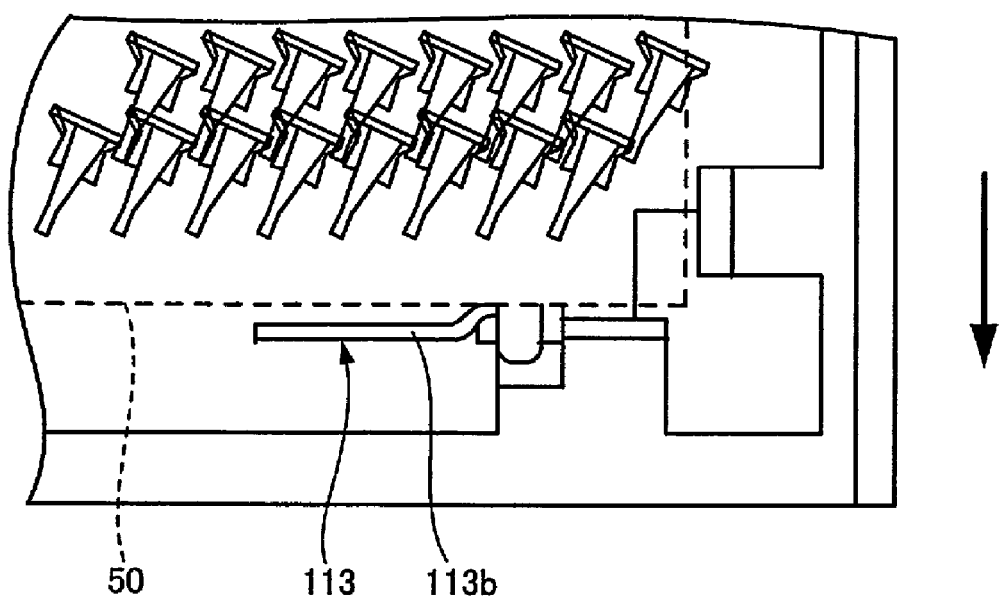
FIG. 7 shows the spring member of FIG. 5 as installed in the insulating housing and when the IC package is initially set in the recess of the insulating housing of FIG. 4.

FIG. 7 shows an appearance of the spring member 113 that is arranged in a right bottom portion of the insulating housing when the IC package is set in the recess 115 of the insulating housing 11 shown in FIG. 4.

An end (free end) of the arm section 113b of the spring member 113 shown in FIG. 7 abuts on the IC package 50, and the end presses the IC package 50 opposite to the direction in which the tip 132 slides the IC package 50.

On the other hand, FIG. 6B shows a view that the IC package 50 set in the recess 115 of the insulating housing 11 receives a vertical load by the pressing cover 13 shown in FIG. 2, and the bottom face 501 of the IC package 50 is pressed down until the bottom face 501 abuts on the bottom wall 115c of the recess 115. As shown in FIG. 6A, if a vertical load is applied to the IC package 50 which is set in a state in which the IC package 50 is settled at the side opposite to the direction in which the IC package 50 is going to slide (see the arrow), the elastic contact 112 of the IC socket 10 falls downward, and a contacting point 112a of the elastic contact 112 moves left in the drawing. At this point, an amount of this movement is described as R in the drawing. When the contacting point 112a of the elastic contact 112 moves left in the drawing, the pad 55 of the package 50 slides as well. Accordingly, by this sliding, oxide film formed on the pad 55 and the contacting point 112a of the elastic contact 112 is removed and the IC package 50 also slides left in the drawing by friction. Thus, the spring member 113 is pressed by the IC package 50, and bent in the direction (left) in which the IC package 50 slides. When the spring member 113 bends a certain amount the spring member 113 reaches the downstream wall 115a in a downstream side of the direction in which the IC package 50 slides. Accordingly, the spring member 113 is prevented from bending further, and the IC package 50 is stopped from further sliding. FIG. 6B shows the IC package 50 that abuts on the spring member 113 which is prevented from bending furthermore, the bottom face 501 of that abuts on the bottom wall 115c of the insulating housing 11, and that is positioned in the predetermined final mount position. At this point, an amount of displacement of the spring member 113 which is displaced until it is prevented from bending furthermore is described as R in the drawing, and this amount of displacement corresponds to an amount of sliding of the IC package 50.

According to the IC socket 10, an amount of relative movement of the contact point 112a to the pad 55 of the IC package 50 becomes |R-S|.

Figure 8:
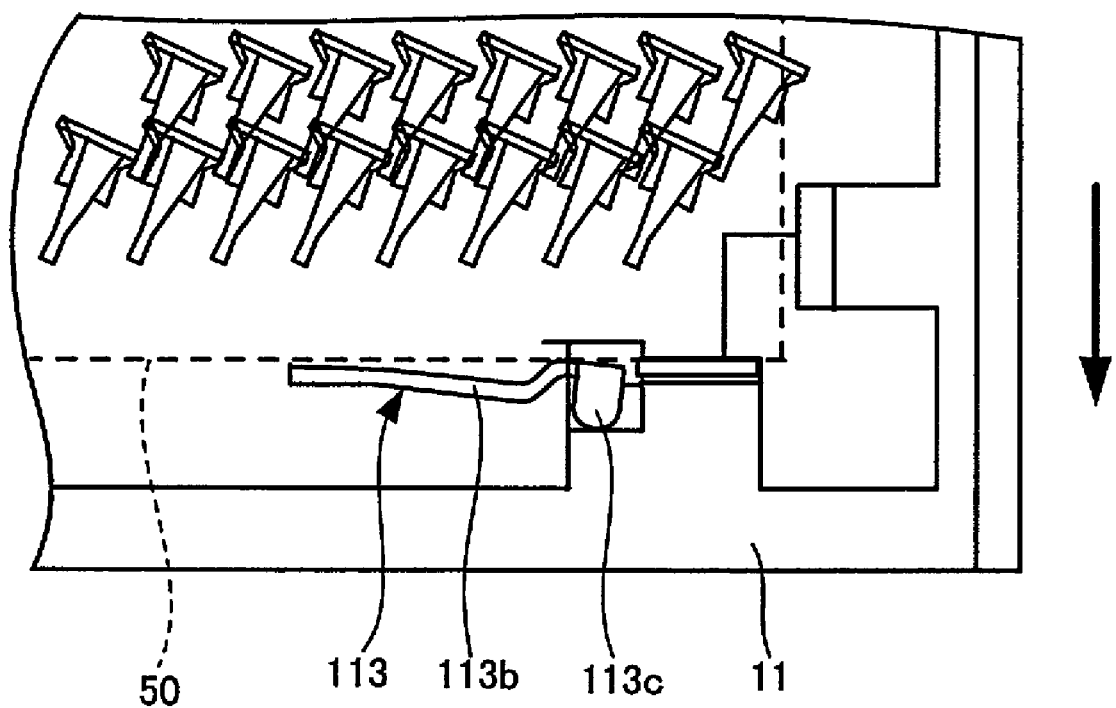
FIG. 8 shows the spring member of FIG. 5 as installed in the insulating housing and when the IC package is in the final predetermined position in the insulating housing of FIG. 4.

FIG. 8 shows an appearance of the spring member 113 that is arranged in a right bottom portion of the insulating housing 11 when the IC package 50 is set in the final predetermined mount position.

FIG. 8 shows a state in which the end (a free end) of the arm section 113b of the spring member 113 is pressed in the direction in which the IC package 50 slides (see the arrow), the bending section 113c reaches the insulating housing 11, and the spring member 113 is prevented from bending furthermore. In other words, the IC package 50 that slides is positioned in the final predetermined mount position by the spring member 113.

In addition, the IC package 50 that slides may be positioned in the mounting position by the insulating housing 11 such that the IC package 50 that slides into the mount position is caused to abut on the insulating housing 11.

As described above, the IC package 50 that is mounted in an accepting position in which the IC package 50 abuts on the downstream wall 115b of the recess 115 in the upstream side of the direction in which the IC package 50 slides. The accepting position is a position where each of the plurality of pads 55 of the IC package 50 contacts respectively each of the plurality of elastic contacts 112 of the IC socket 10. Accordingly, for the IC socket 10 according to the exemplary embodiment, there is no need to suppose that the IC socket 10 accepts the IC package in an initial state in which the IC package 50 is settled at the side in the direction in which the IC package 50 slides. Furthermore, size of the pad 55 of the IC package 50 is small by an amount of distance in which the IC package 50 slides from the accepting position to the mount position, i.e. the amount of S shown in FIGS. 6A and 6B (|R-S|). This leads to high density of the pad 55 of the IC package 50, resulting in high density of the elastic contact 112 of the IC socket 10.

In addition, because the spring member 113 is made of metal and the circuit board 51 (of the IC package 50) made of epoxy resin abuts on the spring member 113, neither is the package 50 prevented from moving down, nor is the spring member 113 scraped.

Since the spring members 113 determine final position of the IC package 50 after the IC package is received into the insulating housing, the IC package 50 need not initially be horizontally located in it final position when first vertically inserted into the insulating housing 11. Also, an amount of relative movement of the elastic contact 112 to the electrical contact point is shortened by the sliding distance in which the IC package 50 slides from the accepting position, thereby allowing increased contact density.

According to the IC socket assembly of the invention, the size of an electrical contact of an IC package can be reduced by the sliding distance in which the IC package 50 slides from the accepting position toward the final predetermined mount position.

What is claimed is:

1. An IC socket for receiving an IC package having a plurality of electrical contacts on a bottom face thereof, comprising:
   an insulating housing that receives the IC package;
   a plurality of elastic contacts each being cantilevered to extend obliquely from the insulating housing, one end each being secured to the insulating housing, and a remaining end of each contacting at least one of the electrical contacts on the bottom face of the IC package; and
   a spring member carried by the insulating housing that determines an accepting position for the IC package being accepted into the insulating housing, and that restrains an amount of horizontal movement of the IC package caused by bending of the elastic contacts as the IC package is pressed down.

2. The IC socket according to claim 1, wherein the IC package abuts an inner wall of the insulating housing while in the accepting position, the inner wall being directionally opposite to a direction in which the IC package is slid as the IC package is pressed down.

3. The IC socket according to claim 1, the spring member comprising:
   a fixing section configured for being press-fit into the insulating housing.

4. The IC socket according to claim 1, the spring member comprising:
   a fixing section configured for being press-fit into the insulating housing; and
   an arm section that extend substantially perpendicularly away from the fixing section.

5. The IC socket according to claim 1, the spring member comprising:
   a fixing section configured for being press-fit into the insulating housing;
   an arm section that extend substantially perpendicularly away from the fixing section; and
   a bent section extending from a free end of the arm section.

6. The IC socket according to claim 5, wherein the bent section, by contacting the insulating housing, restrains the amount of horizontal movement of the IC package caused by bending of the elastic contacts as the IC package is pressed down.

7. The IC socket according to claim 5, wherein the bent section is bent toward the direction the IC package horizontally moves due to the bending of the elastic contacts as the IC package is pressed down.

8. The IC socket according to claim 5, wherein the bent section is disposed between the IC package and the insulating housing.

9. An IC socket assembly comprising an IC package having a plurality of electrical contacts on a bottom face thereof and further comprising an IC socket that receives the IC package, the IC socket comprising:
   an insulating housing that receives the IC package;
   a plurality of elastic contacts each being cantilevered to extend obliquely from the insulating housing, one end each being secured to the insulating housing, and a remaining end of each contacting at least one of the electrical contacts on the bottom face of the IC package; and
   a spring member carried by the insulating housing that determines an accepting position for the IC package being accepted into the insulating housing, and that restrains an amount of horizontal movement of the IC package caused by bending of the elastic contacts as the IC package is pressed down.

10. The IC socket assembly according to claim 9, wherein the IC package abuts an inner wall of the insulating housing while in the accepting position, the inner wall being directionally opposite to a direction in which the IC package is slid as the IC package is pressed down.

11. The IC socket assembly according to claim 9, the spring member comprising:
    a fixing section configured for being press-fit into the insulating housing.

12. The IC socket assembly according to claim 9, the spring member comprising:
    a fixing section configured for being press-fit into the insulating housing; and
    an arm section that extend substantially perpendicularly away from the fixing section.

13. The IC socket assembly according to claim 9, the spring member comprising:
    a fixing section configured for being press-fit into the insulating housing;
    an arm section that extend substantially perpendicularly away from the fixing section; and
    a bent section extending from a free end of the arm section.

14. The IC socket assembly according to claim 13, wherein the bent section, by contacting the insulating housing, restrains the amount of horizontal movement of the IC package caused by bending of the elastic contacts as the IC package is pressed down.

15. The IC socket assembly according to claim 13, wherein the bent section is bent toward the direction the IC package horizontally moves due to the bending of the elastic contacts as the IC package is pressed down.

16. The IC socket assembly according to claim 13, wherein the bent section is disposed between the IC package and the insulating housing.

* * * * *